United States Patent
Hwang

(10) Patent No.: US 11,462,252 B2
(45) Date of Patent: Oct. 4, 2022

(54) CONTROLLER AND SEMICONDUCTOR SYSTEM INCLUDING A CONTROLLER

(71) Applicant: SK hynix Inc., Icheon-si (KR)

(72) Inventor: Minsoon Hwang, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/225,901

(22) Filed: Apr. 8, 2021

(65) Prior Publication Data

US 2021/0225419 A1 Jul. 22, 2021

Related U.S. Application Data

(63) Continuation of application No. 16/879,480, filed on May 20, 2020, now Pat. No. 10,998,021, which is a continuation of application No. 16/206,507, filed on Nov. 30, 2018, now Pat. No. 10,692,551.

(30) Foreign Application Priority Data

May 18, 2018 (KR) .......................... 10-2018-0057252

(51) Int. Cl.
*G11C 7/22* (2006.01)
*G11C 29/02* (2006.01)

(52) U.S. Cl.
CPC ............ *G11C 7/222* (2013.01); *G11C 29/022* (2013.01); *G11C 29/023* (2013.01); *G11C 29/028* (2013.01)

(58) Field of Classification Search
CPC ...... G11C 7/222; G11C 29/022; G11C 29/023; G11C 29/028
See application file for complete search history.

(56) References Cited

U.S. PATENT DOCUMENTS

| 9,129,669 | B2  |   | 9/2015  | Song                   |
|-----------|-----|---|---------|------------------------|
| 9,147,463 | B1  | * | 9/2015  | Sarraju ........ G11C 7/22 |
| 2013/0272454 | A1 |  | 10/2013 | Watanabe et al.        |
| 2014/0375365 | A1 |  | 12/2014 | Liu                    |
| 2018/0090186 | A1 | * | 3/2018  | Kang ........... H03L 7/091 |
| 2019/0122714 | A1 | * | 4/2019  | Shin ........... G11C 7/1093 |
| 2019/0371388 | A1 |  | 12/2019 | Hiraishi                |
| 2020/0143854 | A1 | * | 5/2020  | Kim ........... G11C 7/1078 |

FOREIGN PATENT DOCUMENTS

| JP | 2009117025 A    | 5/2009 |
|----|-----------------|--------|
| KR | 1020090035508 A | 4/2009 |
| KR | 1020160074969 A | 6/2016 |
| KR | 1020160075094 A | 6/2016 |

\* cited by examiner

*Primary Examiner* — Han Yang
(74) *Attorney, Agent, or Firm* — William Park & Associates Ltd.

(57) ABSTRACT

A controller configured to perform a training process of sampling data using multi-phase signals which are internally generated according to a data strobe signal, and compensating for a delay time of the data strobe signal using a control code which is generated according to the sampling result.

6 Claims, 5 Drawing Sheets

CONTROLLER AND SEMICONDUCTOR SYSTEM INCLUDING A CONTROLLER

CROSS-REFERENCES TO RELATED APPLICATION

The present application is a continuation application of U.S. patent application Ser. No. 16/879,480, filed on May 20, 2020, which is a continuation application of U.S. patent application Ser. No. 16/206,507, filed on Nov. 30, 2018, and claims priority under 35 U.S.C. § 119(a) to Korean application number 10-2018-0057252, filed on May 18, 2018, in the Korean Intellectual Property Office, which is incorporated herein by reference in its entirety.

BACKGROUND

1. Technical Field

Various embodiments generally relate to a controller, and more particularly, to a controller and semiconductor system including a controller configured to perform a training function.

2. Related Art

With the increase in operation speeds of semiconductor devices, training has become important for accurately exchanging data in a semiconductor system which includes a semiconductor device. For example, a semiconductor system may have a semiconductor device including a semiconductor memory and a controller for controlling the semiconductor memory (for example, a processor such as a CPU or GPU or a memory controller included in the processor).

For a semiconductor device, command training, read training or write training may be performed according to a predetermined order.

For example, the read training may be performed through a method in which the controller aligns a strobe signal with the center of data by repeating a process of reading data based on the strobe signal provided from the semiconductor memory.

Therefore, there is a demand for a training method capable of maintaining precision at a desired level while raising the training speed.

SUMMARY

In an embodiment, a semiconductor system may be provided. The semiconductor system may include a controller configured to perform a training process of sampling data using multi-phase signals which are internally generated according to a data strobe signal, and configured to compensate for a delay time of the data strobe signal using a control code which is generated according to the sampling result.

In an embodiment, a semiconductor system may be provided. The semiconductor system may include a sampling circuit configured to generate sampling signals by sampling data according to multi-phase signals, and output the sampling signals. The semiconductor system may include a detection circuit configured to generate lead flags and trail flags according to the sampling signals. The semiconductor system may include a training control circuit configured to generate a control code according to the lead flags and the trail flags. The semiconductor system may include a multi-phase signal generation circuit configured to output some signals having a desired phase among delayed signals in a delay line for delaying a data strobe signal received by the controller, as the multi-phase signals, delay the data strobe signal by a varied delay time according to a delay control signal, and output the delayed signal as a compensated data strobe signal.

In an embodiment, a controller may be provided. The controller may be configured to perform a training process of sampling data using multi-phase signals which are internally generated according to a data strobe signal, and compensating for a delay time of the data strobe signal using a control code which is generated according to the sampling result.

In an embodiment, a controller may be provided. The controller may include a sampling circuit configured to generate sampling signals by sampling data according to multi-phase signals, and output the sampling signals. The controller may include a detection circuit configured to generate lead flags and trail flags according to the sampling signals. The controller may include a training control circuit configured to generate a control code according to the lead flags and the trail flags. The controller may include a multi-phase signal generation circuit configured to output some signals having a desired phase among delayed signals in a delay line for delaying a data strobe signal received by the controller, as the multi-phase signals, delay the data strobe signal by a varied delay time according to a delay control signal, and output the delayed signal as a compensated data strobe signal.

DETAILED DESCRIPTION

Hereinafter, a semiconductor system according to the present disclosure will be described below with reference to the accompanying drawings through examples of embodiments.

Various embodiments are directed to a semiconductor system capable of increasing training speed and accuracy.

Figure 1:
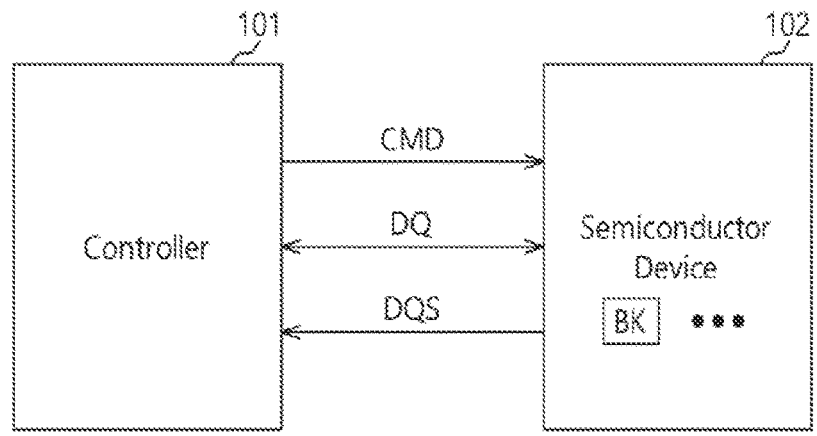
FIG. 1 is a diagram illustrating the configuration of a semiconductor system in accordance with an embodiment.

FIG. 1 illustrates the configuration of a semiconductor system in accordance with an embodiment.

Referring to FIG. 1, the semiconductor system 100 in accordance with an embodiment may include a controller 101 and a semiconductor device 102.

The controller 101 may provide a command CMD to the semiconductor device 102, in order to instruct the semiconductor device 102 to perform a read, write or training mode setting operation.

The controller 101 may perform a read training process of sampling data DQ using multi-phase signals which are internally generated through a data strobe signal DQS, and compensating for a delay time of the data strobe signal DQS using a control code which is generated according to the sampling result.

The controller 101 may perform edge matching operations as a part of the read training process, and complete the read training process according to results of the edge matching operations.

The semiconductor device 102 may provide the data DQ and the data strobe signal DQS to the controller 101 according to the command CMD, for example, a read command.

The semiconductor device 102 may include a plurality of unit memory regions, for example, memory banks BK.

The semiconductor device 102 may store the data DQ provided from the controller 101 in the memory banks BK, according to the command CMD, for example, a write command.

The semiconductor device 102 may provide the data DQ stored in the memory banks BK and the data strobe signal DQS for designating reception timings of the data DQ to the controller 101, according to the command CMD, for example, a read command.

Figure 2:
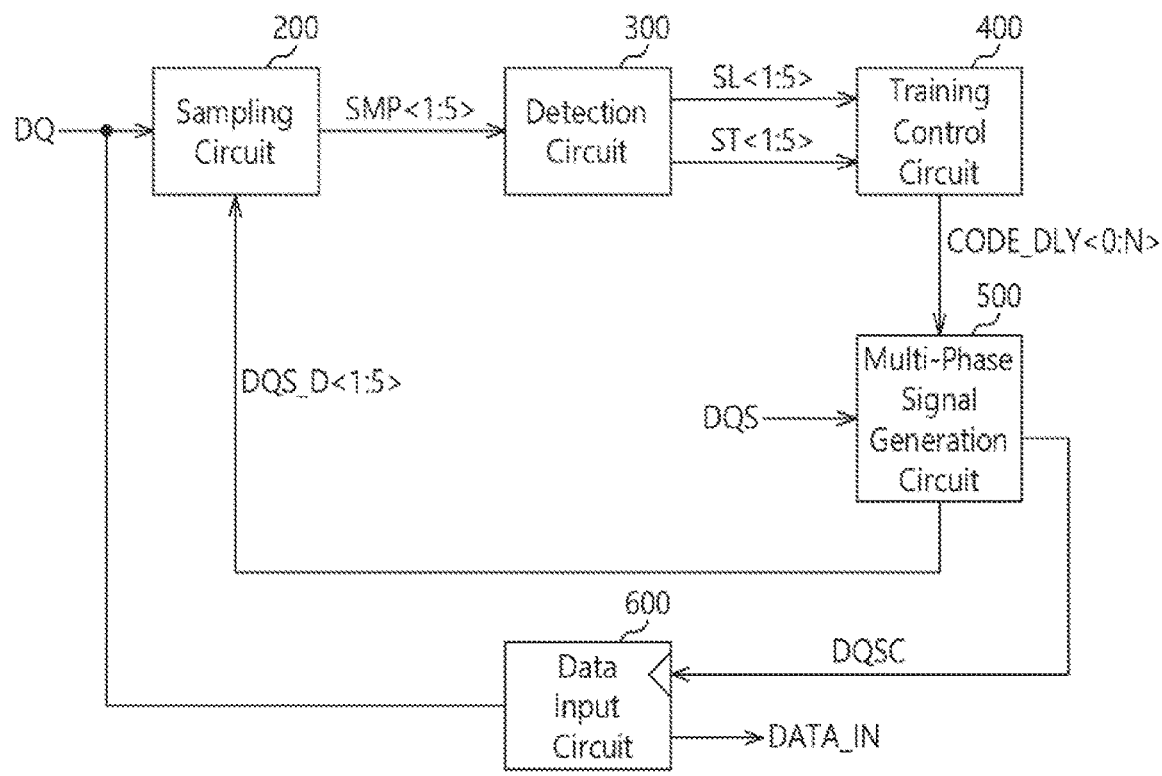
FIG. 2 illustrates the configuration of a controller of FIG. 1.

FIG. 2 illustrates the configuration of the controller of FIG. 1.

Referring to FIG. 2, the controller 101 may include a sampling circuit 200, a detection circuit 300, a training control circuit 400, a multi-phase signal generation circuit 500 and a data input circuit 600.

The sampling circuit 200 may generate sampling signals SMP<1:5> by sampling the data DQ according to multi-phase signals DQS_D<1:5>, and output the generated sampling signals SMB<1:5>.

The sampling circuit 200 may over-sample the data DQ according to the multi-phase signals DQS_D<1:5>.

The period of the multi-phase signals DQS_D<1:5>, i.e. a period from a high-level point of the multi-phase signal DQS_D1 to a high-level point of the multi-phase signal DQS_D5 may be longer than a high-level period of the data DQ.

The sampling circuit 200 may generate the sampling signals SMP<1:5> by over-sampling the data DQ according to the multi-phase signals DQS_D<1:5>, and output the generated sampling signals SMB<1:5>.

The sampling circuit 200 may include a plurality of flip-flops F/F for sampling the data DQ according to the respective multi-phase signals DQS_D<1:5>.

The detection circuit 300 may generate lead flags SL<1:5> and trail flags ST<1:5> according to the sampling signals SMP<1:5>.

The lead flags SL<1:5> and the trail flags ST<1:5> may define whether the multi-phase signals in the same orders as the lead flags SL<1:5> and the trail flags ST<1:5>, among the multi-phase signals DQS_D<1:5>, are lead signals or trail signals.

Among the lead flags SL<1:5> and the trail flags ST<1:5>, a lead/trail flag pair SL1 and ST1 may define whether the multi-phase signal DQS_D1 of the multi-phase signals DQS_D<1:5> is a lead signal or trail signal, and a lead/trail flag pair SL2 and ST2 may define whether the multi-phase signal DQS_D2 of the multi-phase signals DQS_D<1:5> is a lead signal or trail signal. In this way, a lead/trail flag pair SL5 and ST5 may define whether the multi-phase signal DQS_D5 of the multi-phase signals DQS_D<1:5> is a lead signal or trail signal.

The lead signal and the trail signal may correspond to phase signals having the closest transition timings to the transition timings of the data DQ, among the multi-phase signals DQS_D<1:5>.

That is, the lead signal may indicate the immediately previous phase signal of a phase signal whose rising edge initially corresponds to the high-level period of the data DQ, among the mufti-phase signals DQS_D<1:5>.

The trail signal may indicate a phase signal whose rising edge lastly corresponds to the high-level period of the data DQ, among the multi-phase signals DQS_D<1:5>.

The training control circuit 400 may generate a control code CODE_DLY<0:N> according to the lead flags SL<1:5> and the trail flags ST<1:5>.

The training control circuit 400 may store delay codes corresponding to delay values of the respective multi-phase signals DSQ_D<1:5>.

The training control circuit 400 may identify the lead signal among the multi-phase signals DSQ_D<1:5> according to the lead flags SL<1:5>.

The training control circuit 400 may identify the lead signal and the trail signal among the multi-phase signals DSQ_D<1:5> according to the trail flags ST<1:5>.

The training control circuit 400 may perform edge matching operations, i.e. first and second edge matching operations as a part of the read training process, using the control code CODE_DLY<0:N>.

The training control circuit 400 may complete the read training process by setting a value of the control code CODE_DLY<0:N> to a delay time of the multi-phase signal generation circuit 500, the value of the control code CODE_DLY<0:N> corresponding to an intermediate value between the control code CODE_DLY<0:N> corresponding to the lead signal at which the first edge matching operation has been completed and the control code CODE_DLY<0:N> corresponding to the trail signal at which the second edge matching operation has been completed.

The first and second edge matching operations may indicate operations for matching rising edges of the lead signal and the trail signal with rising and falling edges of the data DQ, respectively, while varying some delay codes of the stored delay codes as the control code CODE_DLY<0:N>, the some delay codes corresponding to the lead signal and the trail signal, respectively, among the multi-phase signals DQS_D<1:5>.

The first edge matching operation may indicate an operation of matching the rising edge of the lead signal with the rising edge of the data DQ while varying one delay code of the stored delay codes as the control code CODE_DLY<0:N>, the delay code corresponding to the lead signal among the multi-phase signals DQS_D<1:5>.

The second edge matching operation may indicate an operation of matching the rising edge of the trail signal with the falling edge of the data DQ while varying one delay code of the stored delay codes as the control code CODE_DLY<0:N>, the delay code corresponding to the trail signal among the multi-phase signals DQS_D<1:5>.

The multi-phase signal generation circuit 500 may generate a compensated data strobe signal DQSC by delaying the data strobe signal DQS by the delay time which is varied according to the control code CODE_DLY<0:N>.

The multi-phase signal generation circuit 500 may output some delayed signals having a desired phase, among delayed signals in a delay line for delaying the data strobe signal DQS, as the multi-phase signals DQS_D<1:5>. The delay line will be described later with reference to FIG. 5.

The data input circuit 600 may receive the data DQ and generate internal data DATA_IN, according to the compensated data strobe signal DQSC.

Figure 3:
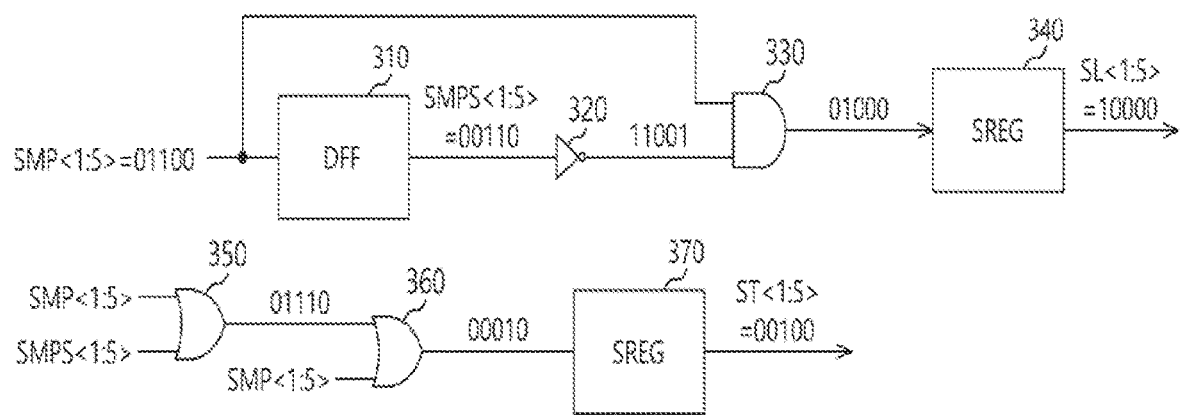
FIG. 3 illustrates the configuration of a detection circuit of FIG. 2.

FIG. 3 illustrates the configuration of the detection circuit of FIG. 2.

Referring to FIG. 3, the detection circuit 300 may include a plurality of flip-flops 310, a plurality of first logic gates 320, a plurality of second logic gates 330, a first shift register 340, a plurality of third logic gates 350, a plurality of fourth logic gates 360 and a second shift register 370.

The plurality of flip-flops 310 may receive the sampling signals SMP<1:5>, and generate shifted sampling signals SMPS<1:5>.

The plurality of first logic gates 320, i.e. a plurality of inverters may invert the shifted sampling signals SMPS<1:5>.

The plurality of second logic gates 330, i.e. a plurality of AND gates may perform a first logical operation, i.e. an AND operation on the sampling signals SMP<1:5> with outputs from the first logic gates 320.

The first shift register SREG 340 may generate the lead flags SL<1:5> by shifting outputs of the plurality of second logic gates 330.

The plurality of third logic gates 350, i.e. a plurality of OR gates may perform a second logical operation, i.e. an OR operation on the sampling signals SMP<1:5> and the shifted sampling signals SMPS<1:5>.

The plurality of fourth logic gates 360, i.e. a plurality of XOR gates may perform a third logical operation, i.e, an XOR operation on outputs of the third logic gates 350 and the sampling signals SMP<1:5>.

The second shift register 370 may generate the trail flags ST<1:5> by shifting outputs of the plurality of fourth logic gates 360.

For example, when the sampling signals SMP<1:5> have a value of '01100', the multi-phase signal DQS_D1 corresponding to the sampling signal SMP1 is the lead signal, and the multi-phase signal DQS_D3 corresponding to the sampling signal SMP3 is the trail signal.

The first shift register 340 may output the lead flags SL<1:5> as '10000', and the second shift register 370 may output the trail flags ST<1:5> as '00100'.

Since the lead flags SL<1:5> have a value of '10000' and the trail flags ST<1:5> have a value of '00100', it may define that the multi-phase signal DQS_D1 is the lead signal and the multi-phase signal DQS_D3 is the trail signal.

For another example, when the sampling signals SMP<1:5> have a value of '00110', the multi-phase signal DQS_D2 corresponding to the sampling signal SMP2 is the lead signal, and the multi-phase signal DQS_D4 corresponding to the sampling signal SMP4 is the trail signal.

The first shift register 340 may output the lead flags SL<1:5> as '01000', and the second shift register 370 may output the trail flags ST<1:5> as '00010'.

Since the lead flags SL<1:5> have a value of '01000' and the trail flags ST<1:5> have a value of '00010', it may define that the multi-phase signal DQS_D2 is the lead signal and the multi-phase signal DQS_D4 is the trail signal.

Figure 4:
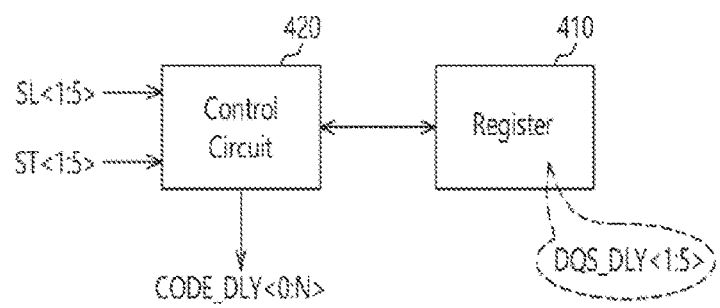
FIG. 4 illustrates the configuration of a training control circuit of FIG. 2.

FIG. 4 illustrates the configuration of the training control circuit of FIG. 2.

Referring to FIG. 4, the training control circuit 400 may include a register 410 and a control circuit 420.

The register 410 may store the delay codes DQS_DLY<1:5> corresponding to the respective delay values of the multi-phase signals DSQ_D<1:5>.

The control circuit 420 may identify the lead signal and the trail signal among the multi-phase signals DQS_D<1:5> according to the lead flags SL<1:5> and the trail flags ST<1:5>, and perform the first and second edge matching operations for matching rising edges of the lead signal and the trail signal with rising and falling edges of the data DQ, respectively, while varying delay codes corresponding to the lead signal and the trail signal among the delay codes DQS_DLY<1:5> as the control code CODE_DLY<0:N>.

The control circuit 420 may complete the read training process by setting a value of the control code CODE_DLY<0:N> to the delay time of the multi-phase signal generation circuit 500, the value of the control code CODE_DLY<0:N> corresponding to an intermediate value between the control code CODE_DLY<0:N> corresponding to the lead signal at which the first edge matching operation has been completed and the control code CODE_DLY<0:N> corresponding to the trail signal at which the second edge matching operation has been completed.

Figure 5:
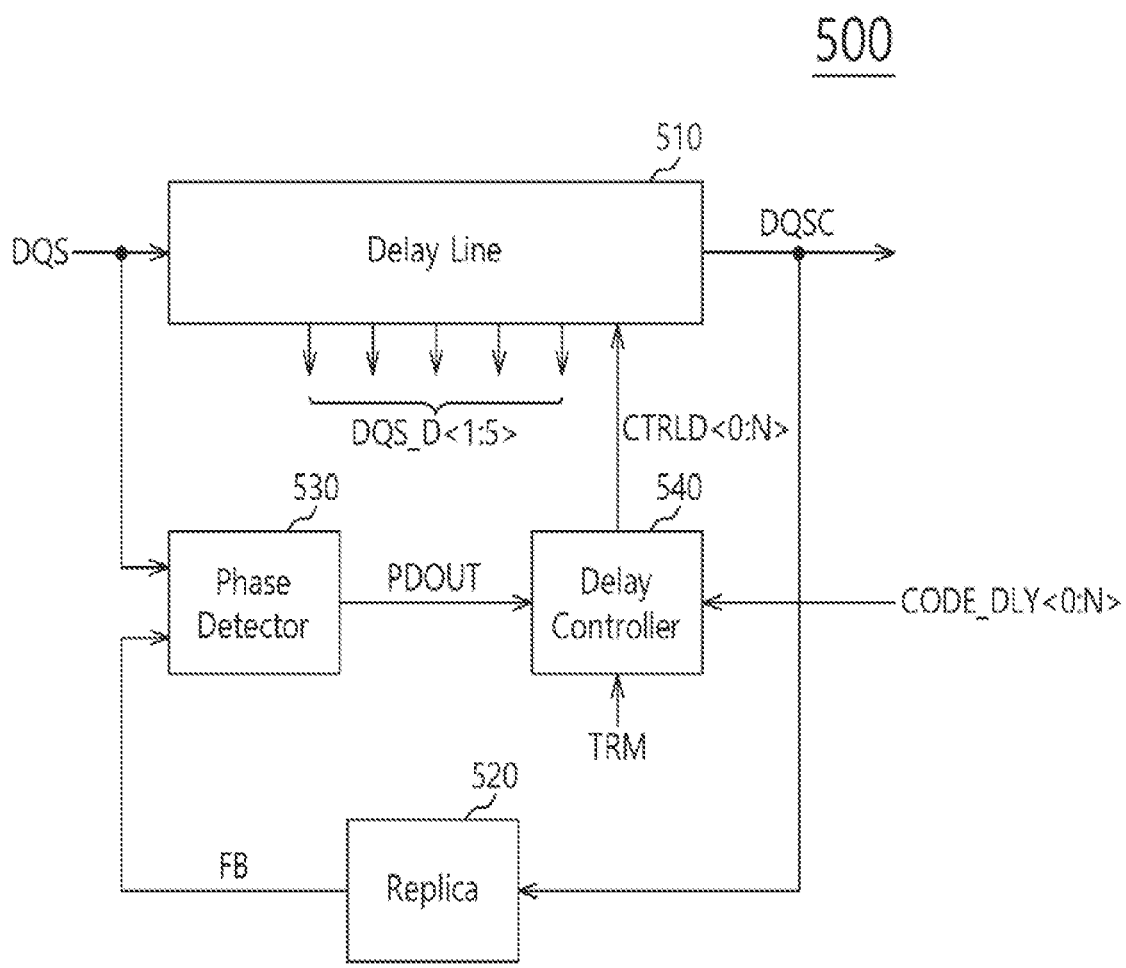
FIG. 5 illustrates the configuration of a multi-phase signal generation circuit of FIG. 2.

FIG. 5 illustrates the configuration of the multi-phase signal generation circuit of FIG. 2.

Referring to FIG. 5, the multi-phase signal generation circuit 500 may generate the compensated data strobe signal DQSC using a replica 520 configured by modeling the internal delay time of the semiconductor device.

A delay locked loop may be applied as the multi-phase signal generation circuit 500.

The multi-phase signal generation circuit 500 may Include a delay line 510, a replica 520, a phase detector 530 and a delay controller 540.

Among the delayed signals in the delay line 510, some delayed signals having a desired phase may be outputted as the multi-phase signals DQS_D<1:5>.

The delay line 510 may delay the data strobe signal DQS by the varied delay time according to a delay control signal CTRLD<0:N>, and output the delayed signal as the compensated data strobe signal DQSC.

The replica 520 may delay the compensated data strobe signal DQSC by a preset delay time, and output the delayed signal as a feedback signal FB.

The word "preset" as used herein with respect to a parameter, such as a preset delay time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The phase detector 530 may generate a phase detection signal PDOUT by detecting a phase difference between the data strobe signal DQS and the feedback signal FB.

The delay controller 540 may generate the delay control signal CTRLD<0:N> for adjusting (increasing or decreasing) the delay time of the delay line 510, according to the phase detection signal PDOUT or the control code CODE_DLY<0:N>.

The delay controller 540 may adjust the value of the delay control signal CTRLD<0:N> using the phase detection signal PDOUT or the control code CODE_DLY<0:N> according to a training mode signal TRM.

The training mode signal TRM may be provided as a kind of command CMD from the controller 101, or internally generated through the command CMD provided from the controller 101.

The delay controller 540 may adjust the delay time of the delay line 510 by varying the value of the delay control signal CTRLD<0:N> according to the control code CODE_DLY<0:N> when the training mode signal TRM is enabled, and adjust the delay time of the delay line 510 by varying the value of the delay control signal CTRLD<0:N> according to the phase detection signal PDOUT when the training mode signal TRM is disabled.

Figure 6:
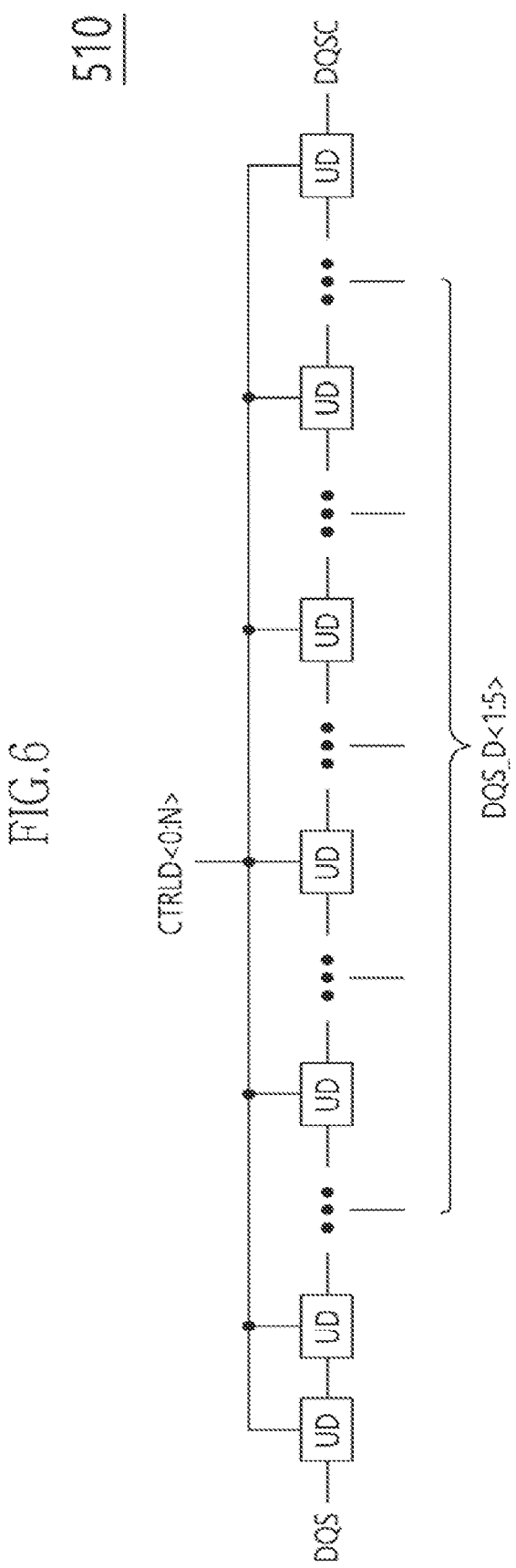
FIG. 6 illustrates the configuration of a delay line of FIG. 5.

FIG. 6 illustrates the configuration of the delay line of FIG. 5.

Referring to FIG. 6, the delay line 510 may include a plurality of unit delays UD coupled to each other.

Among the delayed signals in the delay line 510, i.e. output signals of the unit delays UD, some signals having a desired phase may be outputted as the multi-phase signals DQS_D<1:5>.

The delay time between the multi-phase signals DQS_D<1:5> may have a larger value than the unit delays UD of the delay line.

Figure 7:
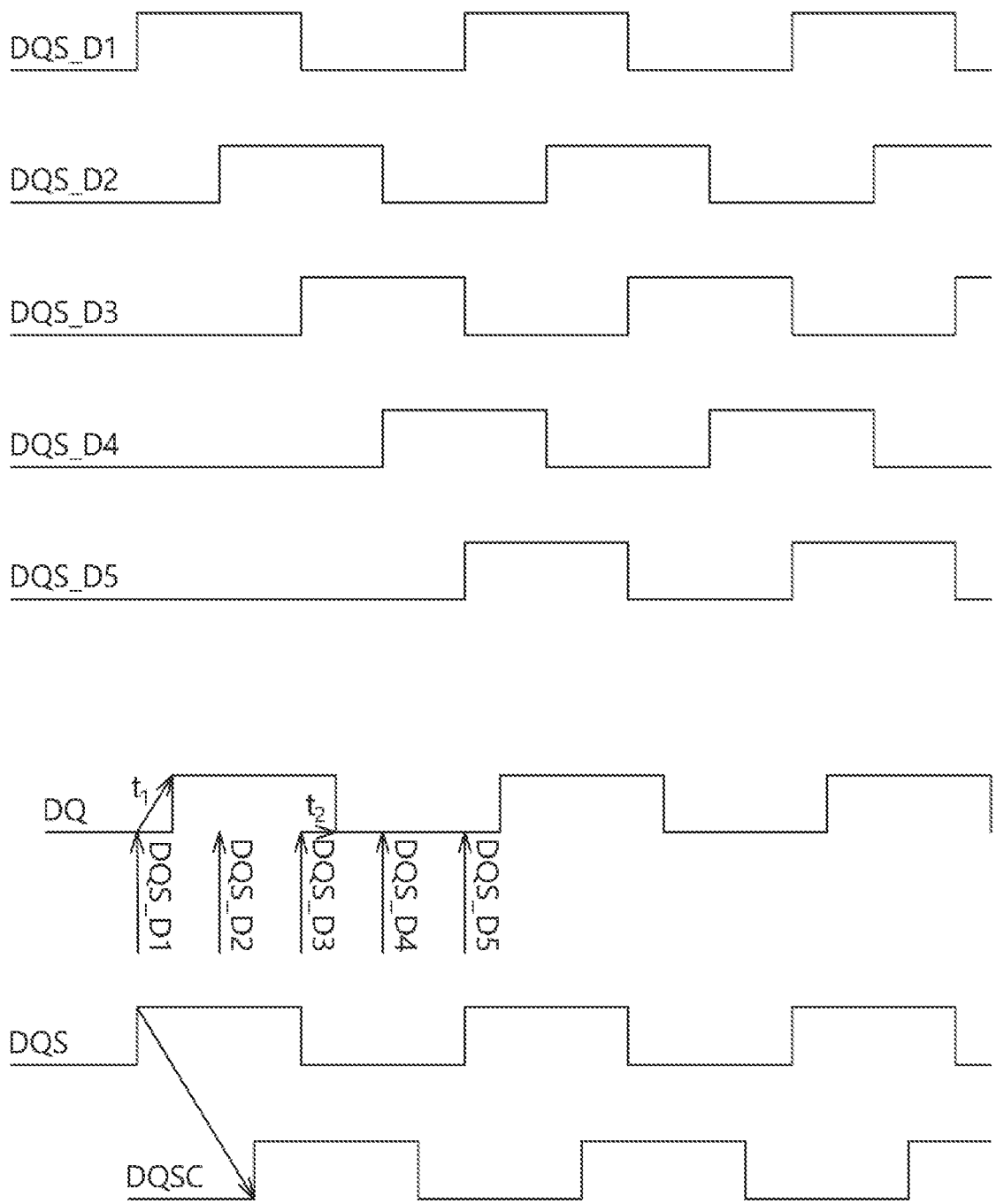
FIG. 7 is a timing diagram for describing a training method in accordance with an embodiment.

FIG. 7 is a timing diagram for describing a training method in accordance with an embodiment.

Referring to FIGS. 1 to 7, the training method in accordance with a present embodiment will be described.

According to the command CMD of the controller 101, the data DQ and the data strobe signal DQS may be outputted from the semiconductor device 102.

The delay line 510 of the multi-phase signal generation circuit 500 in the controller 101 may generate the multi-phase signal DQS_D<1:5>.

The controller 101 may over-sample the data DQ using the multi-phase signals DQS_D<1:5>.

Based on FIG. 7, the sampling signals SMP<1:5> according to the over-sampling result may have a value of '01100'.

Since the sampling signals SMP<1:5> have a value of '01100', the lead flags SL<1:5> may have a value of '10000', and the trail flags ST<1:5> may have a value of '00100'.

The controller 101 may determine that the multi-phase signal DQS_D1 is the lead signal and the multi-phase signal DQS_D3 is the trail signal, according to the lead flags SL<1:5> and the trail flags ST<1:5>.

The controller 101 may perform the first edge matching operation for matching a rising edge of the multi-phase signal DQS_D1 with a rising edge of the data DQ using the delay code DQS_DLY1 as the control code CODE_DLY<0: N>, the delay code DQS_DLY1 corresponding to the multi-phase signal DQS_D1 identified as the lead signal among the delay codes DQS_DLY<1:5> stored in the register 410 of FIG. 4.

The controller 101 may perform the first edge matching operation within time 't1' by controlling the unit delays UD of the delay line 510 of FIG. 6, in order to match the rising edge of the multi-phase signal DQS_D1 with the rising edge of the data DQ.

The controller 101 may store the control code CODE_DLY<0:N> corresponding to the rising edge of the multi-phase signal DQS_D1, matched with the rising edge of the data DQ.

When the first edge matching operation for matching the rising edge of the multi-phase signal DQS_D1 with the rising edge of the data DQ has been completed, the controller 101 may perform the second edge matching operation for matching a rising edge of the multi-phase signal DQS_D3 with a falling edge of the data DQ using the delay code DQS_DLY3 as the control code CODE_DLY<0:N>, the delay code DQS_DLY3 corresponding to the multi-phase signal DQS_D3 identified as the trail signal.

The controller 101 may perform the second edge matching operation within time 't2' by controlling the unit delays UD of the delay line 510 of FIG. 6, in order to match the rising edge of the multi-phase signal DQS_D3 with the falling edge of the data DQ.

The controller 101 may store the control code CODE_DLY<0:N> corresponding to the rising edge of the multi-phase signal DQS_D3, matched with the falling edge of the data DQ.

The controller 101 may calculate the intermediate value between the control code CODE_DLY<0:N> corresponding to the rising edge of the multi-phase signal DQS_D1 and the control code CODE_DLY<0:N> corresponding to the rising edge of the multi-phase signal DQS_D3, and set the calculated value as the final control code in the multi-phase signal generation circuit 500. Then, the controller 101 may end the read training process.

The multi-phase signal generation circuit 500 may generate the compensated data strobe signal DQSC by delaying the data strobe signal DQS according to the final control code.

Through the above-described read training process, the compensated data strobe signal DQSC may be aligned with the center of the data DQ.

Therefore, the data input circuit 600 of FIG. 2 may stably receive the data DQ according to the compensated data strobe signal DQSC, and generate internal data DATA_EN.

In a present embodiment, both of the lead signal and the trail signals may be used to perform the read training process. However, this configuration is only an example, and only the lead signal may be used to perform the read training process.

While various embodiments have been described above, it will be understood to those skilled in the art that the embodiments described are examples only. Accordingly, the operating method of a data storage device described herein should not be limited based on the described embodiments.

What is claimed is:

1. A memory system comprising:
   a memory device configured to output a data and a data strobe signal according to a command; and
   a controller configured to perform a training process of sampling the data and compensating for a delay time of the data strobe signal.

2. The memory system according to claim 1, wherein the controller is configured to perform the training process using multi-phase signals.

3. The memory system according to claim 2, wherein the controller is configured to generate the multi-phase signals according to the data strobe signal.

4. The memory system according to claim 2, wherein the controller is configured to output some signals having a desired phase among delayed signals in a delay line for delaying the data strobe signal, as the multi-phase signals.

5. The memory system according to claim 1, wherein the controller is configured to compensate for the delay time of the data strobe signal using a control code.

6. The memory system according to claim 5, wherein the controller is configured to generate the control code according to a result of the sampling the data.

* * * * *